(12) United States Patent
Chang et al.

(10) Patent No.: US 8,536,616 B2
(45) Date of Patent: Sep. 17, 2013

(54) MULTILAYER SUBSTRATE HAVING GALLIUM NITRIDE LAYER AND METHOD FOR FORMING THE SAME

(75) Inventors: Edward Yi Chang, Hsinchu (TW); Yu-Lin Hsiao, Hsinchu (TW); Jung-Chi Lu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/570,758

(22) Filed: Aug. 9, 2012

(65) Prior Publication Data

US 2012/0298991 A1    Nov. 29, 2012

Related U.S. Application Data

(62) Division of application No. 12/976,598, filed on Dec. 22, 2010, now Pat. No. 8,263,425.

(30) Foreign Application Priority Data

Oct. 25, 2010 (TW) .............................. 99136289 A

(51) Int. Cl.
*H01L 33/30* (2010.01)

(52) U.S. Cl.
USPC ............................................ 257/103; 257/79

(58) Field of Classification Search
USPC ...................................... 257/79–103, E21.09
See application file for complete search history.

(56) References Cited

U.S. PATENT DOCUMENTS 7,781,777 B2 *    8/2010  Yasuda et al. .................... 257/79
7,847,313 B2 *   12/2010  Shibata ........................ 257/101
8,058,082 B2     11/2011  Yu et al.
8,168,460 B2      5/2012  Miki et al.
2008/0197369 A1   8/2008  Batres et al.

OTHER PUBLICATIONS

Chang et al., "Epitaxial Growth of GaN with Graded AlGaN on Patterned Silicon (111) Substrates by Metal-Organic Chemical Vapor Deposition", A Thesis, Submitted to Degree Program of Semiconductor Material and Process Equipment, College of Engineering, National Chiao Tung University (Jul. 2010).
Chen et al., "Stress relaxation in the GaN/AlN multilayers grown on mesh-patterned Si(111) substrate", Journal of Applied Physics, vol. 98 (2005).
Dadgar et al., "Crack-Free InGaN/GaN Light Emitters on Si(111)", phys. stat. sol., vol. 188, No. 1, pp. 155-158 (2001).
Jia et al., "AlGaN-GaN HEMTs on Patterned Silicon (111) Substrate", IEEE Electron Device Letters, vol. 26, No. 3 (Mar. 2005).

\* cited by examiner

*Primary Examiner* — Cuong Q Nguyen
(74) *Attorney, Agent, or Firm* — Edwards Wildman Palmer LLP; Peter F. Corless, Esq.; Richard B. Emmons, Esq.

(57) ABSTRACT

The present invention provides a method for forming a multilayer substrate having a gallium nitride layer, wherein a mesh layer having a plurality of openings is formed on a substrate, and a buffer layer, three aluminum gallium nitride layers with different aluminum concentrations and a gallium nitride layer are formed in sequence on the substrate in the openings. The three aluminum gallium nitride layers with different aluminum concentrations are capable of releasing stress, decreasing cracks on the surface of the gallium nitride layer and controlling interior defects, such that the present invention provides a gallium nitride layer with larger area, greater thickness, no cracks and high quality for facilitating the formation of high performance electronic components in comparison with the prior art. The present invention further provides a multilayer substrate having a gallium nitride layer.

4 Claims, 5 Drawing Sheets

MULTILAYER SUBSTRATE HAVING GALLIUM NITRIDE LAYER AND METHOD FOR FORMING THE SAME

This application is a divisional of U.S. patent application Ser. No. 12/976,598, filed Dec. 22, 2010, which claims the benefit of Taiwanese Application No. 99136289, filed Oct. 25, 2010. The aforementioned patent applications are hereby incorporated by reference in their entirety.

BACKGROUND OF THE INVENTION

1. Field of the Invention

The present invention relates to a multilayer substrate having a gallium nitride layer and a method for forming the same, and more particularly, to a multilayer substrate having a gallium nitride layer with a relatively greater thickness and a relatively larger area and a method for forming the same.

2. Description of Related Art

In recent years, power electronic having silicon are significantly used in components of electric ground vehicles such as converters or inverters. However, these electronic components have performance restricted by property of silicon, and thus need to be fabricated by other materials.

Gallium nitride (GaN) has better physical property than silicon, and can be further grown on a silicon substrate so as to lower fabrication cost. Therefore, gallium nitride is a potential material for forming electronic components in electric ground vehicles.

However, in the conventional art, a gallium nitride layer formed on a silicon substrate has cracks resulting from tensile stress which are disadvantageous to following applications. Further, when the thickness or area of the gallium nitride layer is increased, more cracks occur, such that it is difficult to form a gallium nitride layer with a greater thickness. In addition, since there is a lattice mismatch between a gallium nitride layer and a silicon substrate, defects easily occur in the gallium nitride layer. Therefore, the efficacy of electronic components having gallium nitrides cannot be improved. Specifically, the electronic component has leakage current, the restricted direct current characteristic and the restricted breakdown voltage due to the gallium nitride layer with less thickness and high defect density.

In "AlGaN—GaN HEMTs on patterned silicon (111) substrate", IEEE Electron Device Letters vol. 3, No. 26, Mar. 2005, Shou Jia et al. disclose an epitaxial structure, wherein trenches are formed on a silicon substrate by etching, a plurality of rectangular bumps are formed, and a gallium nitride layer is formed on each bump. The gallium nitride layer having a thickness of 1.5 μm is formed on a very small area (30 μm$^2$).

In "Stress relaxation in the GaN/AlN multilayers grown on a mesh-patterned Si(111) substrate", Journal of Applied Physics vol. 98, 2005, C. H. Chen et al. disclose that a GaN layer is formed on a silicon (111) substrate, and then multi-layers of GaN/AlN/GaN/AlN/GaN/AlN are formed on the silicon (111) substrate. However, the thickness of the outmost gallium nitride layer is only 1 μm.

Further, in "Crack-Free InGaN/GaN Light Emitters on Si (111)" phys. stat. sol. vol. 1, No. 188, A. Dadgar et al. disclose that a patterned GaN layer is formed on a silicon (111) substrate, 15 pairs of AlGaN/GaN layers are formed on the substrate (111) substrate, and then a GaN layer is formed. Although the thickness of the resulting GaN layer is 3.61 μm, the area of the GaN layer is only 100 μm$^2$.

Therefore, the gallium nitride layer has insufficent thickness for being used in electronic components in the prior art.

Accordingly, there is a need to develop a gallium nitride layer with a greater thickness, larger area and no cracks.

SUMMARY OF THE INVENTION

The present invention provides a method for forming a multilayer substrate having a gallium nitride layer. The method of the present invention includes the steps of providing a substrate; forming a mesh layer having a plurality of openings on the substrate; forming a buffer layer essentially consisting of a plurality of nitride layers on the substrate in the openings; forming in sequence a lower aluminum gallium nitride layer, an intermediate aluminum gallium nitride layer and an upper aluminum gallium nitride layer with different aluminum concentrations on the buffer layer, wherein an aluminum concentration of the lower aluminum gallium nitride layer is higher than an aluminum concentration of the intermediate aluminum gallium nitride layer, the aluminum concentration of the intermediate aluminum gallium nitride layer is higher than an aluminum concentration of the upper aluminum gallium nitride layer, and while forming the intermediate aluminum gallium nitride layer, aluminum proportion is decreased along with an increase of a thickness of the intermediate aluminum gallium nitride layer; and forming a gallium nitride layer on the upper aluminum gallium nitride layer.

In accordance with the method of the present invention, the mesh layer can be made of silicon nitride, and be formed by the steps of forming a silicon nitride layer on the substrate; forming a mesh resist layer on the silicon nitride layer; removing a portion of the silicon nitride layer without being covered by the mesh resist layer to form the mesh layer; and removing the mesh resist layer.

In accordance with the present invention, the method further includes the step of forming a top aluminum gallium nitride layer on the gallium nitride layer.

In the method of the present invention, the substrate is made of silicon, sapphire, gallium nitride, zinc oxide or silicon carbide, and the nitride layers are selected from the group consisting of an aluminum nitride layer, a gallium nitride layer and an aluminum gallium nitride layer.

In the method of the present invention, the buffer layer is a high-temperature nitride layer/low-temperature nitride layer/high-temperature nitride layer, the high-temperature nitride layer is formed at 10004200° C., and the low-temperature nitride layer is formed at 700-900° C.

The present invention further discloses a multilayer structure having a gallium nitride layer. The multilayer substrate of the present invention includes a substrate; a mesh layer disposed on the substrate and having a plurality of openings for exposing the substrate; a buffer layer disposed on the substrate in the openings and essentially consisting of a plurality of nitride layers; a lower aluminum gallium nitride layer, an intermediate aluminum gallium nitride layer and an upper aluminum gallium nitride layer with different aluminum concentrations formed in sequence on the buffer layer, wherein an aluminum concentration of the lower aluminum gallium nitride layer is higher than an aluminum concentration of the intermediate aluminum gallium nitride layer, the aluminum concentration of the intermediate aluminum gallium nitride layer is higher than an aluminum concentration of the upper aluminum gallium nitride layer, and the aluminum concentration of the intermediate aluminum gallium nitride layer is decreased in an upward direction from the lower aluminum gallium nitride layer; and a gallium nitride layer disposed on the upper aluminum gallium nitride layer.

In the present invention, the multilayer substrate further includes a top aluminum gallium nitride layer disposed on the gallium nitride layer.

In the multilayer substrate of the present invention, the substrate is made of silicon, sapphire, gallium nitride, zinc oxide or silicon carbide, the mesh layer is made of silicon nitride, and the nitride layers are selected from the group consisting of an aluminum nitride layer, a gallium nitride layer and an aluminum gallium nitride layer.

In the multilayer substrate of the present invention, the buffer layer is a high-temperature nitride layer/low-temperature nitride layer/high-temperature nitride layer, the high-temperature nitride layer is formed at 1000-1200° C., and the low-temperature nitride layer is formed at 700-900° C.

Accordingly, in the method of the present invention, a mesh layer having a plurality of openings is formed on a substrate, then a buffer layer and three aluminum gallium nitride layers with different aluminum concentrations are formed on the substrate in the openings in sequence, and a gallium nitride layer is formed on the upper aluminum gallium nitride layer. The multilayer substrate of the present invention has three aluminum gallium nitride layers with different aluminum concentrations for releasing stress, decreasing cracks on the surface of the gallium nitride layer and controlling interior defects, such that the present invention provides a gallium nitride layer with larger area, greater thickness, no cracks and high quality in comparison with the prior art. Hence, the multilayer substrate having a gallium nitride layer of the present invention is advantageous to subsequent processing of electronic components with high breakdown voltage tolerance.

DETAILED DESCRIPTION OF THE PREFERRED EMBODIMENTS

The detailed description of the present invention is illustrated by the following specific examples. Persons skilled in the art can conceive the other advantages and effects of the present invention based on the disclosure contained in the specification of the present invention.

Figure 1A:
FIG. 1A to FIG. 1I are schematic views showing the method for forming the multilayer substrate according to the present invention, wherein FIG. 1E' is a top view of the structure shown in FIG. 1E.
Figure 1B:
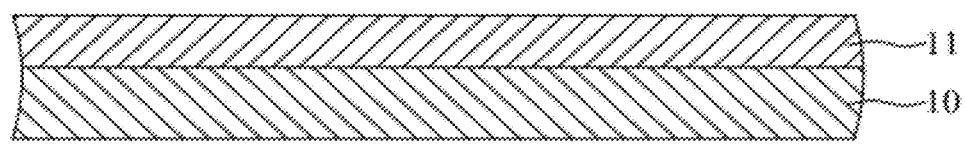
Figure 1C:
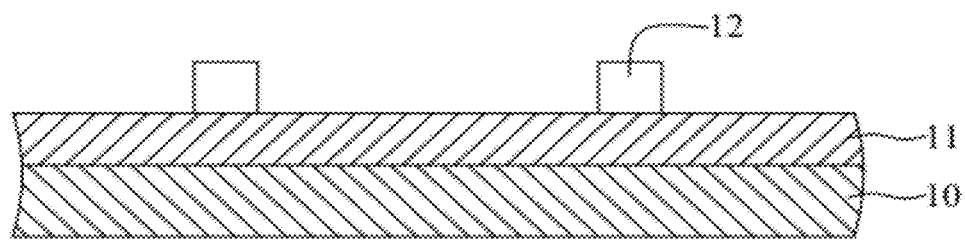
Figure 1D:
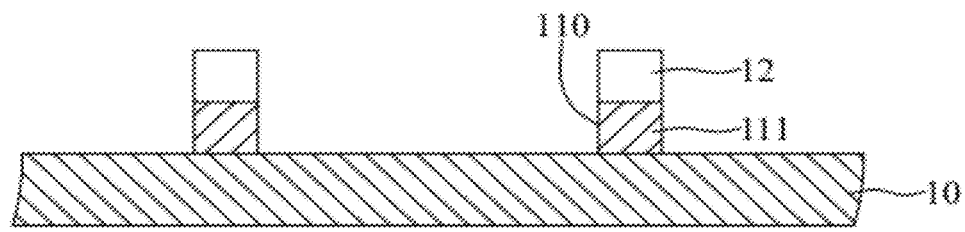
Figure 1E:
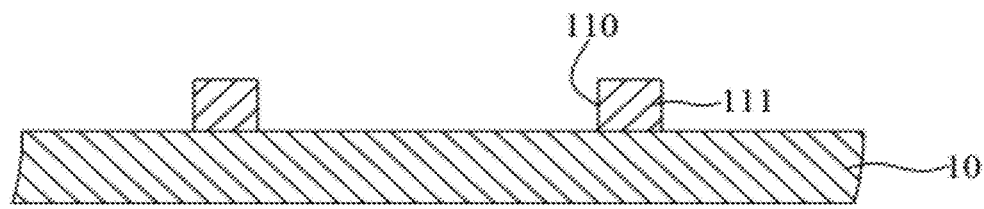
Figure 1E:
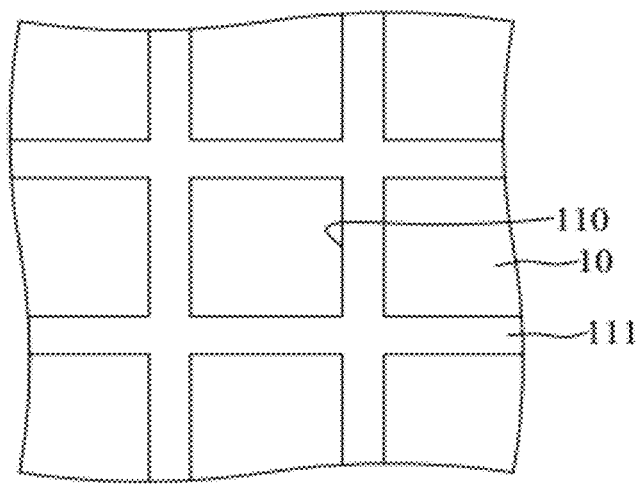

FIG. 1A to FIG. 1I show the top views of the multilayer substrate formed in the method of the present invention, in which FIG. 1E' is the top view of the structure shown in FIG. 1E.

As shown in FIG. 1A, a substrate 10 is provided. The substrate 10 may be made of silicon, sapphire, gallium nitride, zinc oxide or silicon carbide, and the substrate 10 is preferably a silicon substrate with crystal planes (111).

As shown in FIG. 1B, a silicon nitride ($Si_xN_y$) layer 11 with a thickness of 300 nm is formed on the substrate 10 by the PECVD machine.

As shown in FIG. 1C, a mesh resist layer 12 is formed on the silicon nitride layer 11.

As shown in FIG. 1D, the portion of the silicon nitride layer 11 which is not covered by the mesh resist layer 12 is removed to form a mesh layer 111. The mesh layer 111 has a plurality of openings 110 for exposing the substrate 10.

As shown in FIG. 1E and FIG. 1E', the mesh resist layer 12 is removed, and the mesh layer 111 with the openings 110 is shown as a rectangular grid. Certainly, the mesh layer 111 with the openings 110 may be shown as other shaped grid. The openings 110 of the mesh layer 111 are preferably rectangles with a width of 300 or 1000 μm. According to the above illustrations, the patterned substrate is formed.

Figure 1F:
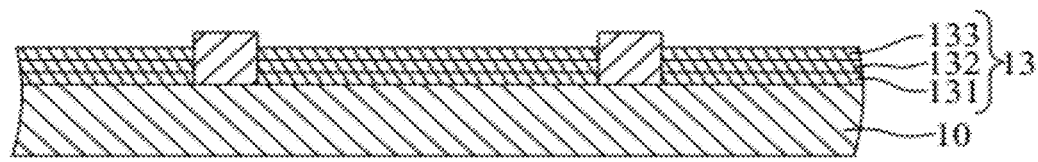

As shown in FIG. 1F, a buffer layer 13 is formed on the substrate 10 in the openings 110 by the MOCVD machine. The buffer layer 13 essentially consists of a plurality of nitride layers. In the present embodiment, the buffer layer 13 is the high-temperature (HT) nitride layer 133/low-temperature (LT) nitride layer 132/high-temperature nitride layer 131. The high-temperature nitride layers 131, 133 are formed at 1000-1200° C., preferably at 1030° C. The low-temperature nitride layer 132 is formed at 700-900° C., preferably at 800° C. Further, the nitride layers in the buffer layer 13 may be aluminum nitride layers, gallium nitride layers or aluminum gallium nitride layers. In one embodiment of the present invention, each nitride layer in the buffer layer is made of single material such as aluminum nitride.

Figure 1G:
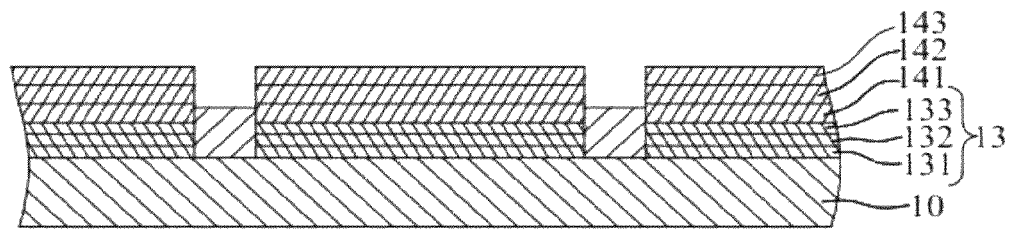

As shown in FIG. 1G, three aluminum gallium nitride layers with different aluminum concentrations are formed in sequence on the buffer layer 13, i.e. a lower aluminum gallium nitride layer 141, an intermediate aluminum gallium nitride layer 142 and an upper aluminum gallium nitride layer 143. The components of the lower aluminum gallium nitride layer 141 and the upper aluminum gallium nitride layer 143 are fixed. During the formation of the intermediate aluminum gallium nitride layer 142, the proportion of aluminum is gradually decreased (or the proportion of gallium is relatively increased) along with the increase of the thickness of the intermediate aluminum gallium nitride layer 142. In other words, the components of the intermediate aluminum gallium nitride layer 142 are graded. In addition, the aluminum concentration of the lower aluminum gallium nitride layer 141 is higher than that of the intermediate aluminum gallium nitride layer 142, and the aluminum concentration of the intermediate aluminum gallium nitride layer 142 is higher than that of the upper aluminum gallium nitride layer 143. Specifically, the lower aluminum gallium nitride layer 141 is made of $Al_{0.29}Ga_{0.71}N$, the intermediate aluminum gallium nitride layer 142 is made of $Al_xGa_{1-x}N$ (x being decreased gradually from 0.29 to 0.07 along with the increase of the thickness), and the upper aluminum gallium nitride layer 143 is made of $Al_{0.07}Ga_{0.93}N$.

Figure 1H:
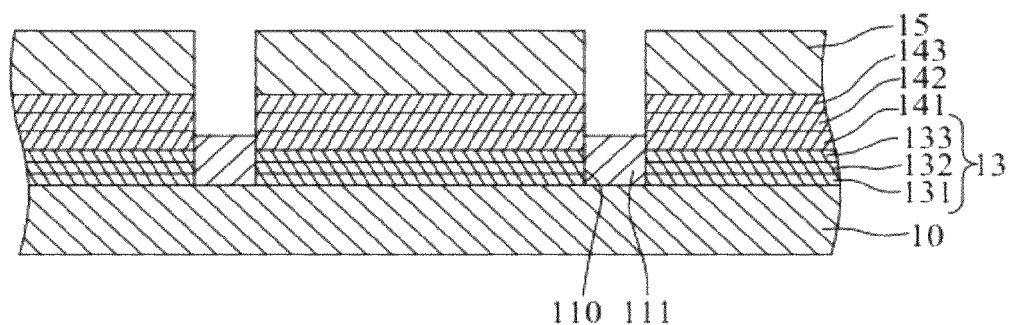

As shown in FIG. 1H, a gallium nitride layer 15 is formed on the upper aluminum gallium nitride layer 143 with low aluminum concentration.

Figure 1I:
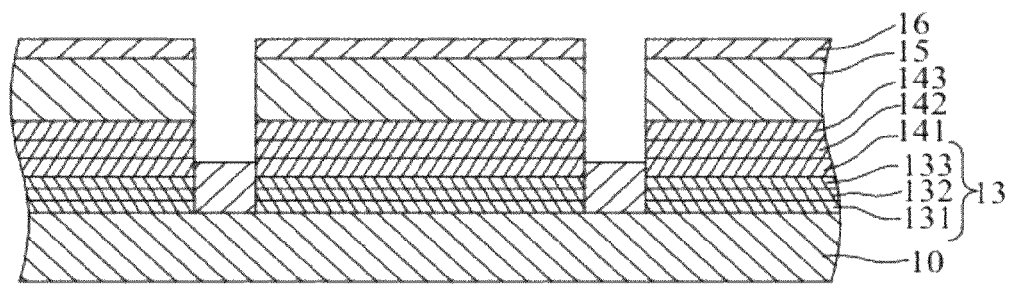

As shown in FIG. 1I, a top aluminum gallium nitride layer 16 is formed on the gallium nitride layer 15.

The present invention further provides a multilayer substrate having a gallium nitride layer. The multilayer substrate includes a substrate 10; a mesh layer 111 disposed on the substrate 10 and having a plurality of openings 110 for exposing the substrate 10; a buffer layer 13 disposed on the substrate 10 in the openings 110 and essentially consisting of a plurality of nitride layers; a lower aluminum gallium nitride layer 141, an intermediate aluminum gallium nitride layer 142 and an upper aluminum gallium nitride layer 143 with different aluminum concentrations formed in sequence on the buffer layer 13, wherein an aluminum concentration of the lower aluminum gallium nitride layer 141 is higher than an aluminum concentration of the intermediate aluminum gallium nitride layer 142, the aluminum concentration of the intermediate aluminum gallium nitride layer 142 is higher than an aluminum concentration of the upper aluminum gallium nitride layer 143, and the aluminum concentration of the intermediate aluminum gallium nitride layer 142 is decreased in an upward direction from the lower aluminum gallium nitride layer; and a gallium nitride layer 15 disposed on the upper aluminum gallium nitride layer 143, which has low aluminum concentration.

In the present invention, the multilayer structure further has a top aluminum gallium nitride layer 16 on the gallium nitride layer 15.

In the multilayer substrate of the present invention, the substrate 10 is made of silicon, sapphire, gallium nitride, zinc oxide or silicon carbide, and the mesh layer 111 is made of silicon nitride.

In the present invention, the buffer layer 13 is a high-temperature nitride layer 133/low-temperature nitride layer 132/high-temperature nitride layer 131, the high-temperature nitride layers 131, 133 are formed at 1000-1200° C., and the low-temperature nitride layer 132 is formed at 700-900° C. The nitride layers are selected from the group consisting of an aluminum nitride layer, a gallium nitride layer and an aluminum gallium nitride layer.

Figure 2A:
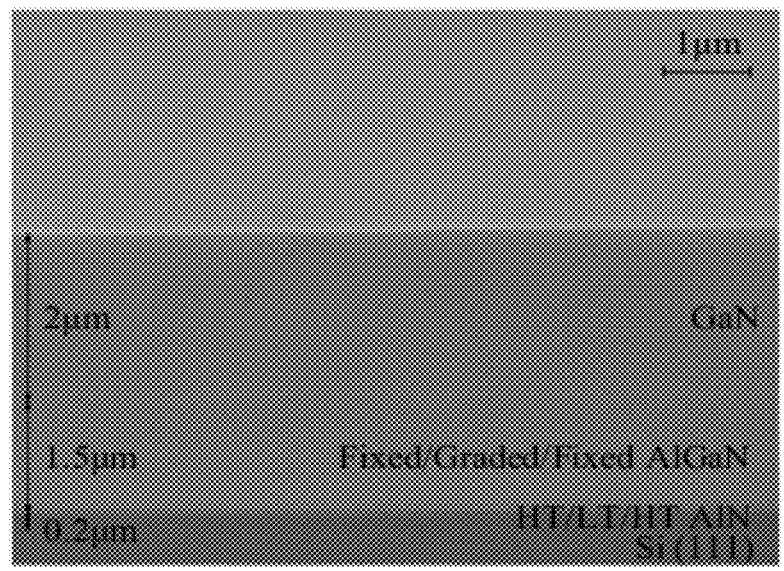
FIG. 2A and FIG. 2B are images showing the sectional view of the multilayer substrate of the present invention by scanning electron microscope and the top view of the multilayer substrate of the present invention by optical microscope, respectively.
Figure 2B:
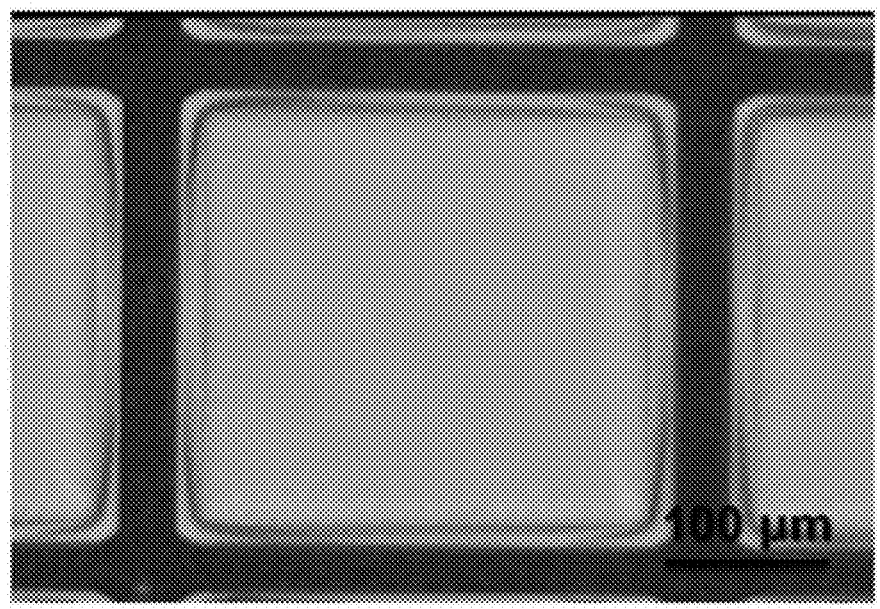

FIG. 2A and FIG. 2B are images showing the sectional view of the multilayer substrate of the present invention by scanning electron microscope and the top view of the multilayer substrate of the present invention by optical microscope, respectively. As shown in FIG. 2A and FIG. 2B, the gallium nitride layer 15 with a thickness of 2 µm and without cracks is formed on the substrate 10 with an area of 300 µm$^2$ in the mesh layer 111, wherein the buffer layer 13 is made of aluminum nitride in the present embodiment. Moreover, the present invention provides a gallium nitride layer 15 having a thickness of at least 2.2 µm.

Figure 3A:
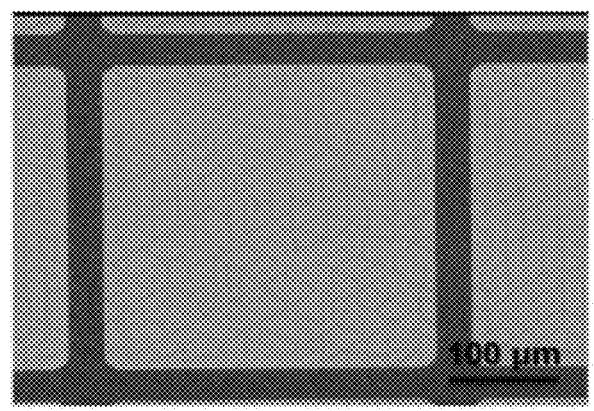
FIG. 3A to FIG. 3C are images showing the top views of the aluminum gallium nitride layer with different thickness and aluminum concentrations in the multilayer substrate by optical microscope according to the present invention.
Figure 3B:
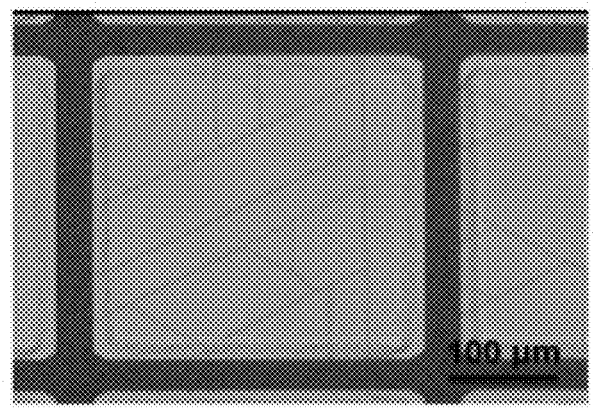
Figure 3C:
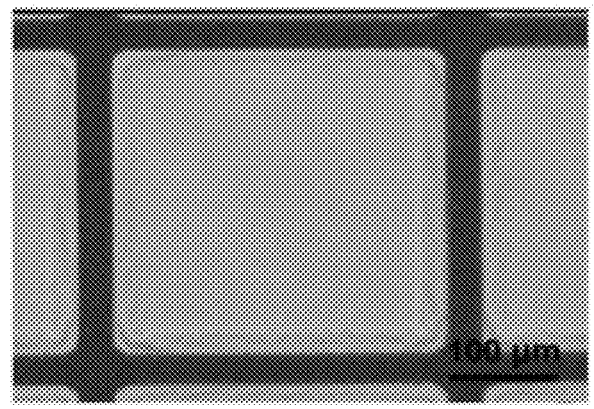

FIG. 3A to FIG. 3C are images showing the top views of the aluminum gallium nitride layer of the multilayer substrate by optical microscope, wherein the intermediate aluminum gallium nitride layers respectively have a thickness of 0, 0.3 and 1.2 µm in FIG. 3A to FIG. 3C (the thickness of the gallium nitride layer is 1 µm). The intermediate aluminum gallium nitride layer produces compression stress for having a balance with tensile stress formed from the gallium nitride layer and the substrate, such that the gallium nitride layer has decreased cracks along with the increase of thickness of the intermediate aluminum gallium nitride layer. Particularly, when the thickness of the intermediate aluminum gallium nitride layer is 1.2 µm and the thickness of the gallium nitride layer is 1 µm, the gallium nitride layer has no cracks.

Accordingly, in the method of the present invention, a mesh layer having a plurality of openings is formed on a substrate, a buffer layer is formed on the substrate in the openings, three aluminum gallium nitride layers with different aluminum concentrations are formed on the buffer layer, and a gallium nitride layer is formed on the upper aluminum gallium nitride layer. The multilayer substrate of the present invention has a mesh layer and three aluminum gallium nitride layers with different aluminum concentrations for releasing stress, decreasing cracks on the surface of the gallium nitride layer and controlling interior defects, such that the present invention provides a gallium nitride layer with larger area, greater thickness, no cracks and high quality in comparison with the prior art. Hence, the multilayer substrate having a gallium nitride layer of the present invention is advantageous to subsequent processing of electronic components with high breakdown voltage tolerance. In addition, a top aluminum gallium nitride layer is formed on the gallium nitride layer so as to facilitate the following formation of high electron mobility transistors (HEMT).

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

The invention claimed is:

1. A multilayer structure having a gallium nitride layer, comprising:
    a substrate;
    a mesh layer disposed on the substrate and having a plurality of openings for exposing the substrate;
    a buffer layer disposed on the substrate in the openings and essentially consisting of a plurality of nitride layers;
    a lower aluminum gallium nitride layer, an intermediate aluminum gallium nitride layer and an upper aluminum gallium nitride layer with different aluminum concentrations in sequence formed on the buffer layer, wherein an aluminum concentration of the lower aluminum gallium nitride layer is higher than an aluminum concentration of the intermediate aluminum gallium nitride layer, the aluminum concentration of the intermediate aluminum gallium nitride layer is higher than an aluminum concentration of the upper aluminum gallium nitride layer, and the aluminum concentration of the intermediate aluminum gallium nitride layer is decreased in an upward direction from the lower aluminum gallium nitride layer; and
    a gallium nitride layer disposed on the upper aluminum gallium nitride layer.

2. The multilayer structure of claim 1, further comprising a top aluminum gallium nitride layer disposed on the gallium nitride layer.

3. The multilayer structure of claim 1, wherein the substrate is made of silicon, sapphire, gallium nitride, zinc oxide or silicon carbide, and the mesh layer is made of silicon nitride, and the nitride layers are selected from the group consisting of an aluminum nitride layer, a gallium nitride layer and an aluminum gallium nitride layer.

4. The multilayer structure of claim 1, wherein the buffer layer is a high-temperature nitride layer/low-temperature nitride layer/high-temperature nitride layer, the high-temperature nitride layer is formed at 1000-1200° C., and the low-temperature nitride layer is formed at 700-900° C.

* * * * *